US012562553B2

(12) United States Patent
O'Daniel et al.

(10) Patent No.: US 12,562,553 B2
(45) Date of Patent: Feb. 24, 2026

(54) MICRO-OPTICS ON VCSEL-BASED FLOOD ILLUMINATOR

(71) Applicant: II-VI Delaware, Inc., Wilmington, DE (US)

(72) Inventors: Jason O'Daniel, Wilmington, DE (US); Pei-Song Cai, Wilmington, DE (US); Hong-Zhi Liu, Wilmington, DE (US); Francesco Schiattone, Wilmington, DE (US)

(73) Assignee: II-VI DELAWARE, INC., Wilmington, DE (US)

( * ) Notice: Subject to any disclaimer, the term of this patent is extended or adjusted under 35 U.S.C. 154(b) by 760 days.

(21) Appl. No.: 17/931,834

(22) Filed: Sep. 13, 2022

(65) Prior Publication Data

US 2024/0088629 A1 Mar. 14, 2024

(51) Int. Cl.
| | |
|---|---|
| *H01S 5/00* | (2006.01) |
| *H01S 5/02253* | (2021.01) |
| *H01S 5/02345* | (2021.01) |
| *H01S 5/183* | (2006.01) |
| *H01S 5/42* | (2006.01) |

(52) U.S. Cl.
CPC ............ *H01S 5/423* (2013.01); *H01S 5/0071* (2013.01); *H01S 5/02253* (2021.01); *H01S 5/02345* (2021.01); *H01S 5/18388* (2013.01)

(58) Field of Classification Search
CPC .... H01S 5/423; H01S 5/0071; H01S 5/02253; H01S 5/02345; H01S 5/18388
See application file for complete search history.

(56) References Cited

U.S. PATENT DOCUMENTS

| | | | | |
|---|---|---|---|---|
| 10,291,332 B2 * | 5/2019 | Gudeman | .......... | G02B 6/12019 |
| 10,374,387 B2 | 8/2019 | Stapleton et al. | | |
| 10,714,892 B2 | 7/2020 | Tatum et al. | | |
| 10,823,365 B2 | 11/2020 | Gray et al. | | |
| 10,971,892 B2 | 4/2021 | Stapleton et al. | | |
| 11,294,107 B2 | 4/2022 | Greiner et al. | | |
| 11,353,634 B2 | 6/2022 | Tatum et al. | | |

(Continued)

OTHER PUBLICATIONS

Bardinal, V, et al., "Collective Micro-Optics Technologies for VCSEL Photonic Integration", Hindawi Publishing Corporation, Advances in Optical Technologies, 2011, 11 pages.

(Continued)

*Primary Examiner* — Kinam Park
(74) *Attorney, Agent, or Firm* — Blank Rome LLP

(57) ABSTRACT

A laser assembly, such as a flood illuminator, has laser (e.g., VCSEL) emitters on a substrate configured to emit optical signals. An optic structure of optically transparent material, such as a polymer, is formed directly on the substrate, and micro-optic elements are nano-imprinted on the optic structure. The micro-optic elements are arranged in optical communication with the optical signals emitted from the laser emitters to perform field mapping or other optical functions. The laser emitters are on the same surface of the substrate as the optic structure along with electrical contacts so forming the optic structure involves covering the electrical contacts with a protective layer, dispensing a polymer for the optic structure, cutting away portions of the optic structure, removing the remaining protective layer, and exposing the electrical contacts.

20 Claims, 4 Drawing Sheets

(56) References Cited

U.S. PATENT DOCUMENTS

| | | | | |
|---|---|---|---|---|
| 2003/0030919 A1* | 2/2003 | Pezeshki | ............ | G02B 26/0841 |
| | | | | 359/726 |
| 2009/0146081 A1* | 6/2009 | Stark | ...................... | B82Y 35/00 |
| | | | | 250/493.1 |
| 2013/0223466 A1* | 8/2013 | Gronenborn | .......... | H01S 5/0267 |
| | | | | 372/50.23 |
| 2016/0080077 A1* | 3/2016 | Joseph | ................... | H04B 10/11 |
| | | | | 398/118 |
| 2016/0164261 A1* | 6/2016 | Warren | ................. | H04N 23/56 |
| | | | | 372/50.122 |
| 2019/0115725 A1 | 4/2019 | Lai et al. | | |
| 2019/0268068 A1* | 8/2019 | Dacha | ...................... | G02B 5/02 |
| 2020/0194973 A1* | 6/2020 | Bloemen | ............. | H01S 5/18388 |
| 2020/0251882 A1* | 8/2020 | Lyon | ................. | G02B 27/0922 |
| 2021/0057889 A1 | 2/2021 | O'Daniel | | |
| 2023/0291182 A1* | 9/2023 | Wotherspoon | ........ | H01S 5/4006 |

OTHER PUBLICATIONS

Gimkiewicz, Christiane , et al., "Wafer-scale replication and testing of micro-optical components for VCSELs", Proceedings of SPIE, 2004, 15 pages.

Moench, Holger , et al., "VCSEL Arrays with Integrated Optics", Proceedings of SPIE, 2013, 11 pages.

\* cited by examiner

MICRO-OPTICS ON VCSEL-BASED FLOOD ILLUMINATOR

FIELD OF THE DISCLOSURE

The subject matter of the present disclosure is directed to a die-level laser assembly, such as a flood illuminator for use in three-dimensional sensing and two-dimensional imaging. In particular, the subject matter is directed to integrating optics onto the emission side of vertical-cavity surface-emitting lasers (VCSELs).

BACKGROUND OF THE DISCLOSURE

Laser assemblies may be used to provide light sources or illumination in a variety of applications. For example, laser assemblies can be used as flood illuminators, dot projectors, or other devices. These devices can be based on vertical-cavity surface-emitting lasers (VCSELs) and can be incorporated into various products, such as mobile phones and other devices, to provide illumination for infrared (IR) sensors or to provide 3D sensing capabilities, 3D mapping in robotics, face detection, etc.

A flood illuminator can be used as the illumination source for a time-of-flight (ToF) sensor. Such a ToF sensor is a range imaging sensor that employs time-of-flight techniques to resolve the distance between the sensor and a target, by measuring the round-trip time of an artificial light signal (e.g., the time it takes the light signal to travel from the sensor, to the target, and back to the sensor) from the flood illuminator 10. Generally, the ToF sensor scans an entire scene (or a portion thereof) with each laser pulse, rather than point-by-point with a laser beam as generally used in scanning LIDAR systems. Accordingly, a flood illuminator used for a ToF sensor may cover a significant portion or the entirety of a scene, and this may be referred to as flood illumination.

For example, FIG. 1 shows a flood illuminator 10, which can be incorporated within a mobile device or the like. The flood illuminator 10 has a vertical-cavity surface-emitting laser (VCSEL) 30 that modulates a flood beam emitted to a diffuser 46. In turn, the diffuser 46 produces a modulated floodlight having a uniform field of illumination of infrared (IR) light. The floodlight is output onto an object or a person of interest (not shown), and an infrared camera (not shown) captures images of the depth signature from the modulated IR floodlight.

The flood illuminator 10 based on the VCSEL 30 as shown here is being considered more and more as a replacement for conventional illuminators that are based on light-emitting diodes (LEDs). For example, the VCSEL-based flood illuminator 10 is currently used in many 3D sensing time-of-flight applications. However, in some applications, the standard package for the VCSEL-based illuminator 10 is too large.

For example, the standard package for the VCSEL-based flood illuminator 10 shown in FIG. 1 has the VCSEL 30 mounted on a substrate 20 to provide illumination. The substrate 20 has top and bottom electrode pads 22, 24. A housing 40 is mounted to the substrate 20 and includes sidewalls 44 supporting the diffuser 46, which is separated by an air cavity 42 above the VCSEL 30. The diffuser 46 is positioned at a minimum distance away from the VCSEL apertures to function properly. This arrangement protects the diffuser's surface, but the housing 40 holding the diffuser 46 requires a larger package. For harsh environments, the structure of this arrangement also needs to be robust to avoid the diffuser 46 from being cracked or detached.

For a VCSEL-based flood illuminator to be suitable for use in some applications, the package for the VCSEL-based illuminator needs to be as small as possible. Still, the VCSEL-based illuminator needs an integrated beam shaping diffuser to provide a correct illumination pattern. The VCSEL by itself cannot typically meet all of an application's requirements for a target sensor, such as high power, low divergence, single-mode operation, or conforming to ideal power distribution.

The subject matter of the present disclosure is directed to overcoming, or at least reducing the effects of, one or more of the problems set forth above.

SUMMARY OF THE DISCLOSURE

A method of fabricating laser assemblies is disclosed herein. The method comprises: providing a substrate having first arrays of laser emitters being configured to emit optical signals; forming an optic structure on the substrate by applying an optically transparent material to the substrate; and configuring second arrays of micro-optical elements in optical communication with the optical signals emitted from the laser emitters of the first arrays by nano-imprinting the micro-optical elements in the optically transparent material of the optic structure.

To apply the optically transparent material to the substrate, the application step can comprise dispensing a polymer layer on the substrate.

The substrate can comprise first and second surfaces opposite one another. The laser emitters can be disposed at the first surface of the substrate, and the first surface can comprise electrical contacts. To form the optic structure on the substrate, the step of applying the optically transparent material to the substrate can comprise: covering at least the electrical contacts with a protective layer; applying the optically transparent material on the first surface of the substrate and the protective layer; cutting away the optically transparent material from the protective layer; and exposing the electrical contacts by removing the protective layer from the electrical contacts.

In covering at least the electrical contacts with the protective layer, the method can comprise applying a photoresist material on the first surface of the substrate and the electrical contacts; developing the photoresist material; and leaving at least the electrical contacts with the protective layer of negative or positive photoresist material by applying a developer. For example, cutting away the optically transparent material from the protective layer can comprise cutting the optically transparent material with a disc dicing blade.

Nano-imprinting the micro-optical elements in the optically transparent material of the optic structure can comprise the steps of: forming concave lenses, convex lenses, or both concave and convex lenses configured to field map the optical signals for the laser emitters; forming collimating lenses configured to change the divergence of the optical signals for the laser emitters; forming external cavities configured to reduce a number of modes of the optical signals for the laser emitters; forming prisms configured to beam steer the optical signals for the laser emitters; or forming beam transformation surfaces configured to beam shape the optical signals for the laser emitters.

Nanoimprinting the micro-optical elements in the optically transparent material of the optic structure can comprise defining a field mapping optic configured to refract the optical signals from the laser emitters of the first array to a desired irradiance at a target, each of the micro-optic elements being configured to refract the optical signal of a corresponding one of the laser emitters of the first array.

Nanoimprinting the micro-optical elements in the optically transparent material of the optic structure can comprise arranging the micro-optical elements in one-to-one correspondence with the laser emitters of the first array.

The laser emitters of the first array can be vertical-cavity surface-emitting laser (VCSEL) emitters, and the laser assemblies can be flood illuminators.

The method can further comprise singulating individual ones of the laser assemblies from one another, each having one of the first arrays of the laser emitters, a portion of the optic structure, and one of the second arrays of the micro-optical elements.

A laser assembly is also disclosed herein that is fabricated according to the above method. The laser assembly, therefore, includes a substrate, a first array of laser emitters, an optic structure, and a second array of micro-optic elements. The laser emitters on the substrate are configured to emit optical signals. The optic structure of optically transparent material is formed on the substrate. The micro-optic elements are nano-imprinted on the optic structure and are arranged in optical communication with the optical signals emitted from the laser emitters.

The foregoing summary is not intended to summarize each potential embodiment or every aspect of the present disclosure.

DETAILED DESCRIPTION OF THE DISCLOSURE

Figure 1:
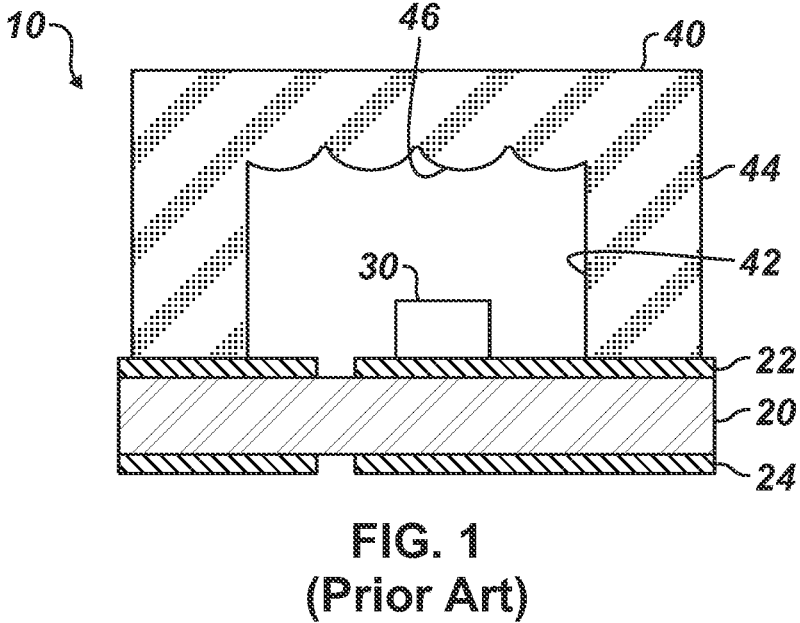
FIG. 1 schematically illustrates a VCSEL-based flood illuminator according to the prior art.
Figure 2:
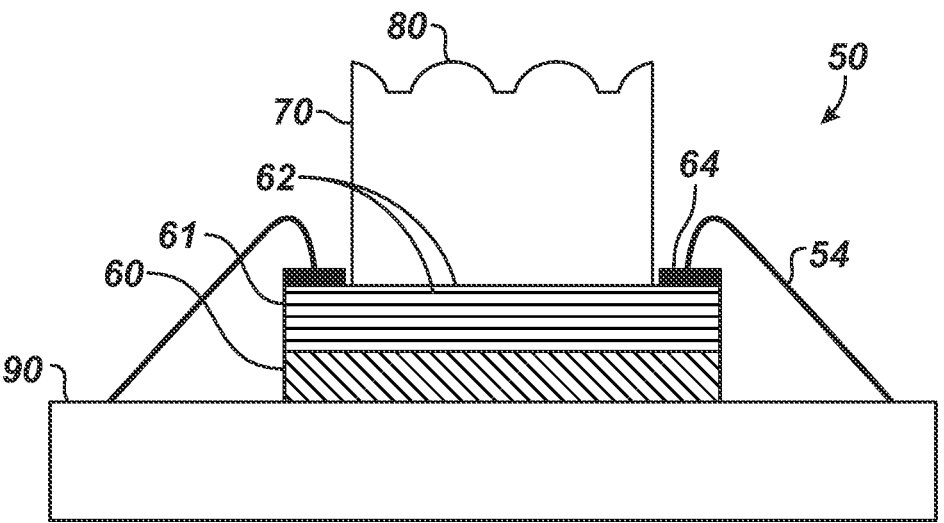
FIG. 2 schematically illustrates a side view of a laser assembly having an array of emitters and having a micro-optic structure integrated thereon according to one configuration of the present disclosure.

FIG. 2 schematically illustrates a side view of a laser assembly 50 of the present disclosure. This laser assembly 50 can be used as a flood illuminator. The laser assembly 50 includes a substrate 60 having a laser array 61 of emitters 62 and includes a micro-optic structure 70 integrated on the substrate 60. As a flood illuminator or other device, the laser assembly 50 can be part of a larger device, such as a time-of-flight (ToF) sensor—only a portion 90 of which is schematically shown here. Wire bonds 54 electrically connect the device 90 to electrical contact pads 64 on the substrate 60.

To decrease costs and create a more compact laser assembly 50, the density of the components in the laser assembly 50 is preferably increased to provide a high-density laser source with many emitters 62 integrated into a small space. Accordingly, the array 61 of multiple laser emitters 62 can be integrated into one chip or die, which leads to higher density and lower manufacturing costs. It is also useful to provide devices with more functionality. In the case of lasers, integrating optical functions directly onto the chip can further lower the overall costs of components and can significantly shrink downstream assembly sizes. Thus, the laser assembly 50 of the present disclosure includes optics and/or optical components fabricated directly onto the chip-level laser assembly 50. For instance, the laser assembly 50 is implemented with a micro-optic structure 70 that has micro-optic elements 80 and is integrally formed on the substrate 60.

Generally, the laser emitters 62 for the laser assembly 50, such as a flood illuminator, can be vertical-cavity surface-emitting laser (VCSEL) emitters or the like. The VCSEL emitters 62 generate optical signals with optical profiles that may not be ideal for illuminating a target. For this reason, the laser assembly 50 includes the micro-optic structure 70 integrated onto the surface of the substrate 60 for the array 61 of VCSEL emitters 62. This micro-optic structure 70 has the micro-optic elements 80 integrated therein to diffuse, direct, focus, refract, and/or modulate the optical signals. For example, the micro-optic structure 70 with the micro-optic elements 80 can operate as a diffuser to change the optical profile of the optical signals to a desired profile more suitable for illuminating a target.

As shown in FIG. 2, the VCSEL emitters 62 lie in an open area between the electrical contacts or pads 66 on the substrate 60, and each VCSEL emitter 62 emits light that passes into the micro-optic structure 70 integrated onto the surface of the substrate 60. The micro-optic elements 80, such as lenses and the like, then shape the light from the VCSEL emitters 62. Each VCSEL emitter 62 can have a corresponding micro-optic element 80 associated directly with it.

As discussed below, semiconductor processes nanoimprint the micro-optic elements 80 directly onto a polymer layer for the micro-optic structure 70 disposed on a top side of the substrate 60. In some configurations, each of the individual micro-optic elements 80 is designed as an individual optic related to a specific one of the VCSEL emitters 62 of the laser array 61. Each corresponding micro-optic element 80 can shape the output from its corresponding VCSEL emitter 62 into a desired optical output. Alternately, in some configurations, a given micro-optic element 80 can be illuminated by several emitters 62 at any given location and can be designed such that the overall output beam profile adheres as closely as possible to a given diffusion profile.

Figure 3:
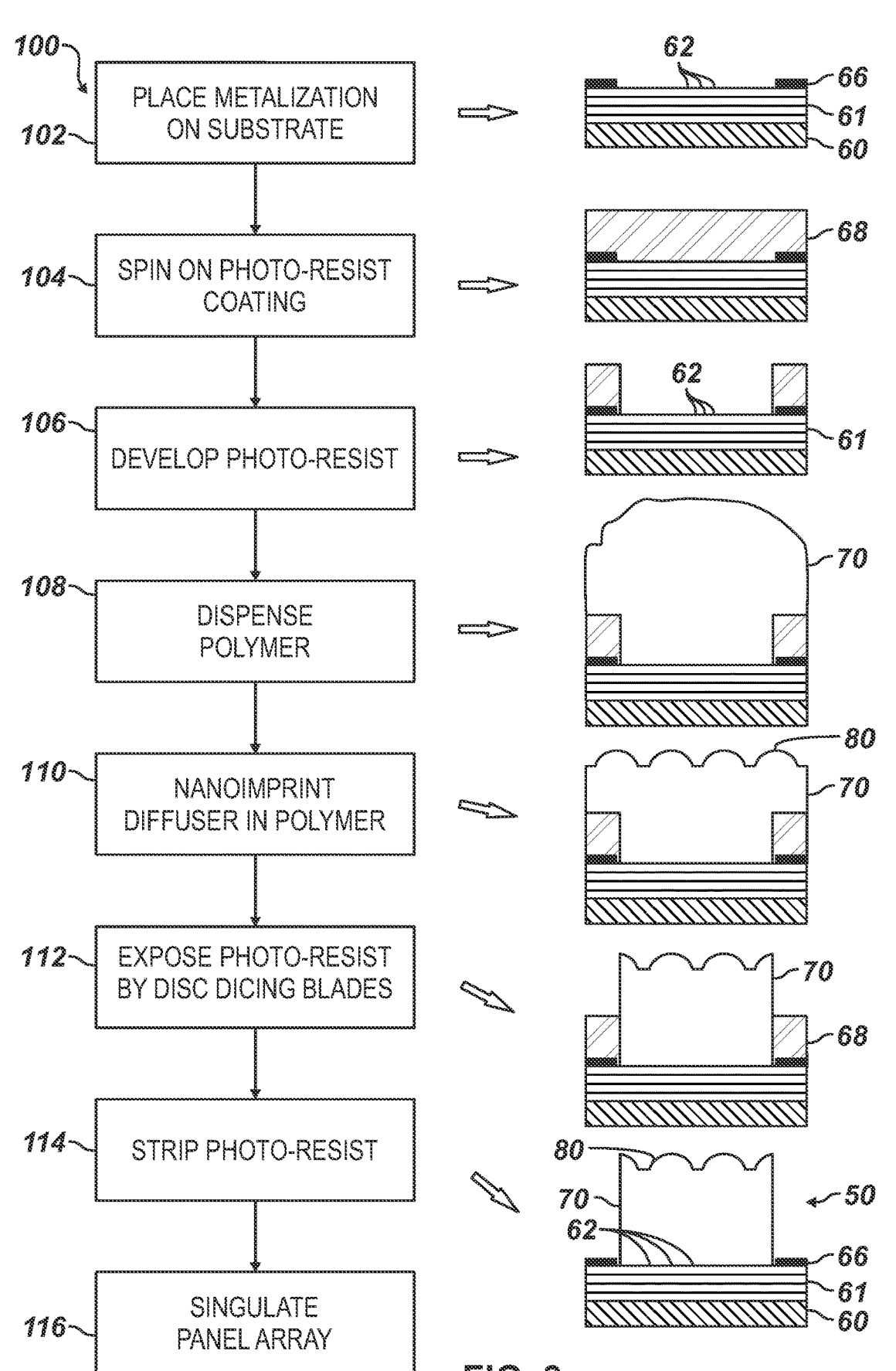
FIG. 3 illustrates a process of forming an integrated micro-optic structure on an array of emitters for a laser assembly according to the present disclosure.

FIG. 3 illustrates a process 100 of forming an integrated micro-optic structure 70 for VCSEL emitters 62 of an array 61 on a substrate 60 according to the present disclosure. The laser assembly 50 can be configured as a VCSEL chip and is shown as a single unit here. However, multiple laser assemblies 50 are fabricated in bulk at the wafer scale and are then segmented into individual dies. For simplicity, only one substrate 60 is shown in FIG. 3, but the steps of the process 100 are performed at the wafer level.

Starting with the substrate 60 having the arrays of VCSEL emitters 62, metallization for the top electrical contacts 66 is placed on the wafer level for each individual assembly 50 (Block 102). A protective layer 68, such as a photoresist material, is applied to the top surface of the substrate 60 for the assemblies 50 (Block 104). The photoresist 68 is then developed and removed so only the top electrical contacts 66 are covered (Block 106). For example, the photoresist material can be applied to the surface of the substrate 60 and the electrical contacts 66, and the photoresist material can be developed using photolithography. At least the electrical contacts 66 can then be left with the protective layer by applying a developer that removes the negative or positive photoresist material, as the case may be.

After developing, at least the electrical contacts 66 remain covered, and the functional optical area of the substrate 60 having the VCSEL emitters 62 is left exposed. Next, a polymer layer for the micro-optic structure 70 is added to the entire wafer (Block 108), and micro-optic elements 80 are formed in the polymer layer of the structure 70 through a nanoimprinting process (Block 110). For example, nanoimprinting the micro-optic elements 80 can use a nanoimprint lithography (NIL) process to fabricate the pattern of nanoscale features. This step can require precise alignment of the micro-optic elements 80 being nanoimprinted to the positions of the VCSEL emitters 62 of the laser array 61.

The photoresist 68 is then exposed by using a dicing process that cuts through only the polymer layer 70 (Block 112). Lastly, the protective photoresist layer 68 is removed through a standard photoresist stripping process to unveil the electrical contact 66 of the substrate 60 (Block 114). The substrate 60 at the wafer level is then singulated to produce the individual assemblies 50 having the integrated micro-optic structures 70 (Block 116). Wire bonding and electrical connections can be made to the electrical contacts 66 on the substrate 60 when it is integrated into a larger device.

As discussed, the micro-optic elements 80 can include a patterned optical surface in the polymer layer of the micro-optic structure 70 integrated on the substrate 60 of the VCSEL emitters 62. The micro-optic structure 70 integrated directly on the substrate 60 can change the output optical properties for each VCSEL emitter 62 and can reduce the need to use an additional external lens and other optics on a resulting device.

The micro-optic elements 80 can provide several optical functions. In general, the micro-optic elements 80 may include any suitable optical components to diffuse, direct, focus, refract, and/or modulate the optical signals. For example, the micro-optic elements 80 can serve as collimating lenses for the VCSEL emitters 62 of the laser array 61 to change the divergence of the optical signals. The micro-optic elements 80 can serve as external cavities for the VCSEL emitters 62 to reduce a number of modes of the optical signals. For beam steering, the micro-optic elements 80 can serve as prisms for the VCSEL emitters 62. For beam shaping, the micro-optic elements 80 can serve as specific beam transformation surfaces for the VCSEL emitters 62.

Additionally, the micro-optic elements 80 can perform field mapping. Some examples are discussed further below.

Figures 4A, 4B, 4C:
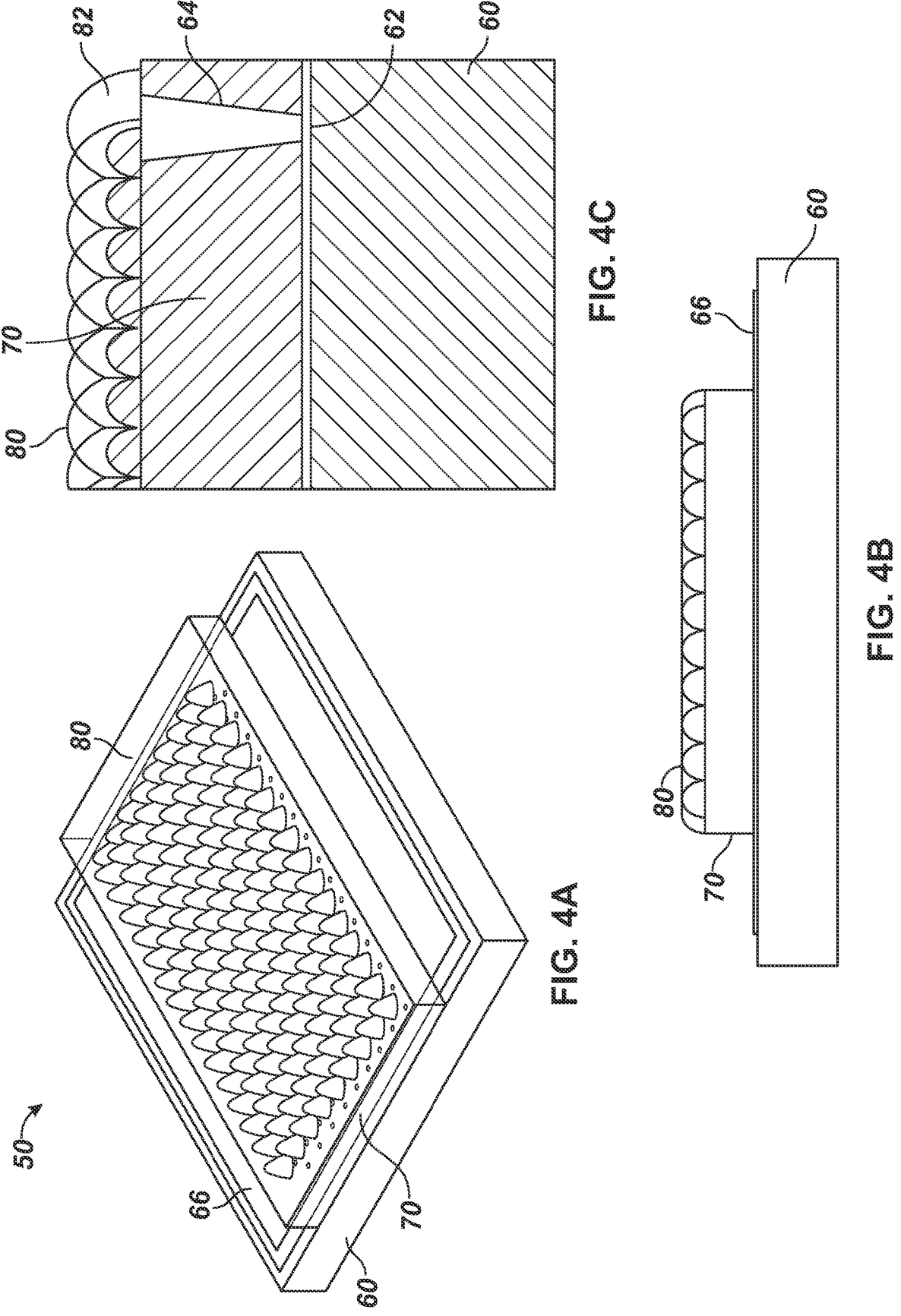
FIG. 4A illustrates a perspective view of a laser assembly having an integrated micro-optic structure according to one configuration.
FIG. 4B illustrates a side view of the laser assembly of FIG. 4A.
FIG. 4C illustrates a detailed view of the laser assembly of FIG. 4A.

FIG. 4A illustrates a perspective view of a laser assembly 50 having an integrated micro-optic structure 70 according to one configuration. FIG. 4B illustrates a side view of the laser assembly 50 of FIG. 4A, and FIG. 4C illustrates a detailed view of the laser assembly 50 of FIG. 4A.

The micro-optic structure 70 shown here includes a polymer layer, which is integrated directly on the substrate 60 of VCSEL emitters 62. The structure 70 has a plurality of individual micro-optic elements 80 in the form of a micro-lenses 82 nanoimprinted therein. For some configurations, each VCSEL emitter 62 preferably has a corresponding micro-lens 82 that can shape (e.g., collimate or diffuse) the optic signal 64 emitted from the VCSEL emitter 62.

In particular, the waves of the optical signals from the VCSEL emitters 62 are diverging in nature so any given point on the optical surface of the micro-optic structure 70 may encounter rays of the optical signals coming from multiple different directions, given that the thickness of micro-optic structure 70 is large enough and given that the emitter-to-emitter spacing allows this to happen. A significant amount of the optical signals would tend to bleed outside an intended illumination area. Accordingly for such configurations, the emitter-to-emitter spacing and the thickness of micro-optic structure 70 can be chosen such that each VCSEL emitter 62 is mapped individually with a micro-lens 82 to generate a desired optical profile individually or as a whole when the optical signals of multiple emitters 62 are combined. In such configurations, the power of the optical signals in the desired illumination area can be significantly higher, providing higher overall optical efficiency.

Figure 5A:
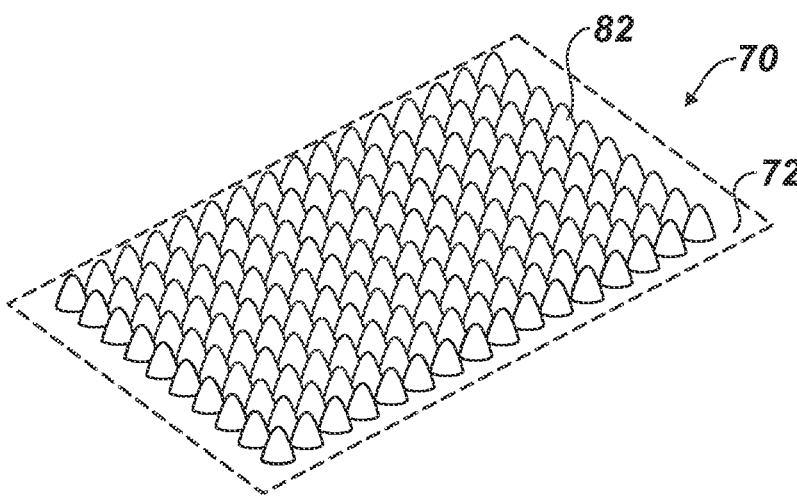
FIG. 5A illustrates a perspective view of micro-optic elements for an integrated micro-optic structure according to one configuration.

As noted above, the micro-optic structure 70 can have individual micro-optic elements 80 in the form of micro-lenses 82 nanoimprinted therein. FIG. 5A illustrates a perspective view of micro-optic elements 80 in the form of micro-lenses 82 for an integrated micro-optic structure 70 according to one configuration. These micro-lenses 82 are convex lenses that can extend from a plane 72, which may correspond to a surface of the micro-optic structure 70 on which the lenses 82 may be positioned or integrally formed. In general, the micro-lenses 82 are illustrated on a three-dimensional scale with dimensions in micrometers (μm). As will be appreciated, the micro-lenses 82 may have other configurations with differing shapes and dimensions, as may be applicable. The most straightforward use of the configuration shown in FIG. 5A is to configure the lens shape for the micro-lenses 82 to minimize the divergence from each emitter 62 (e.g., to collimate the light from each emitter 62), which would thereby minimize the divergence from the overall laser output of the assembly 50.

Figure 5B:
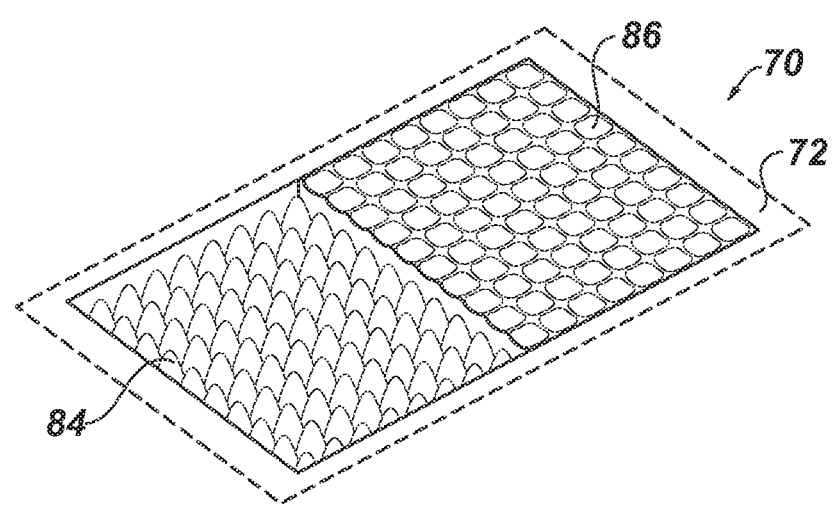
FIG. 5B illustrates a perspective view of micro-optic elements for an integrated micro-optic structure according to another configuration.

FIG. 5B illustrates a perspective view of micro-optic elements 80 for an integrated micro-optic structure 70 according to another configuration. Here, the micro-optic elements 80 include convex lenses 84 and concave lenses 86. In general, the lenses 84, 86 are illustrated on a three-dimensional scale with dimensions in micrometers (μm). As will be appreciated, the lenses 84, 86 may have other configurations with differing shapes and dimensions, as may be applicable.

The convex lenses 84 include a convex shape with respect to a plane 72. The convex lenses 84 may be a positive optical surface or a converging lens. Meanwhile, the concave lenses 86 include a concave shape with respect to the plane 72. The concave lenses 86 may be a negative optical surface or a diverging lens. For its part, the plane 72 may correspond to a surface of the micro-optic structure 70 on which the lenses 84, 86 may be positioned or integrally formed.

The lenses 84, 86 may be freeform surfaces that are designed to redistribute the optical signals (e.g., illumination intensity) to a target profile at a surface a desired distance away. The lenses 84, 86 may diverge, refract, and/or direct the optical signals in preferred directions to conform to the desired target profile. As will be appreciated, the target profile may be larger than what the natural divergence of the VCSEL emitters (62) can produce. Accordingly, the lenses 84, 86 diverge the optical signals at an angle, which may be greater than the natural divergence angle of the VCSEL emitters (62). For example, the illumination angle requirements may be significantly greater than 30 degrees. In comparison, natural optical divergence for a VCSEL emitter (62) may be approximately 20 degrees.

As disclosed herein, the micro-optic structure 70 can be used for optical field mapping and/or diffusion of optical signals. For field mapping, the micro-optic elements 80 refract or redistribute irradiance of the optical signals into a desired irradiance at a target surface at a sufficient distance from the micro-optic elements 80. Optical field mapping may also be referred to as irradiance reshaping, irradiance redistribution, laser beam shaping, or freeform surface illumination, among others.

Implementing field mapping with the micro-optic elements 82 requires good optical alignment of the micro-optic elements 80 to the VCSEL emitters 62, which may be beyond fabrication tolerance capabilities. For this reason, the micro-optic elements 80 can use both positive (e.g., more convex or converging) optics (e.g., convex lenses 84) and negative (e.g., more concave or diverging) optics (e.g., concave lenses 86) as disclosed herein. The lenses 84, 86 can be designed for the same desired output profile, and the pairs of opposite lenses 84, 86 (which may be nearly equal in number) may counterbalance small alignment offsets (e.g., within a few microns). Such a configuration may permit the micro-optic elements 80 to be better aligned with the emitters 62 within fabrication tolerance capabilities.

The array of lenses 84, 86 can be arranged in separate portions, as shown in FIG. 5B. The lenses 84, 86 may be configured to output substantially the same output optical profile. Each portion can have the same number and arrangement of the lenses 84, 86 as shown, but other arrangements can be used. As described, these opposite lenses 84, 86 may counterbalance small alignment offsets in the laser array 61, thereby increasing the tolerance of the laser assembly 50 as a whole. Such configurations may permit the lenses 84, 86 of the laser array 61 to be aligned within fabrication tolerance capabilities to the emitters 62, especially when the VCSEL emitters 62 are disposed on the other side of the substrate 60 as in the configuration of FIGS. 6A-6C.

The lens array may include more or fewer of one type of lens 84, 86 than the other. More portions can be used or can be arranged in different patterns. One type of lens 84, 86 may alternate per lens, by row, by column, randomly, or the like with the other type. Other suitable configurations may be implemented according to concepts described in this disclosure. Details of configurations as in FIG. 5B can be found in U.S. application Ser. No. 16/995,270 filed Aug. 17, 2020, which is incorporated herein by reference in its entirety.

For emitter configurations where the laser emitters 62 are close together relative to the thickness of the micro-optic structure 70, light from adjacent emitters 62 may overlap at the optic surface. In this case, the collection of micro-optic elements 80 can be any sort of possible diffuser surface, including a regular array of microlenses, a random array of microlenses, or a randomized surface.

Figure 6:
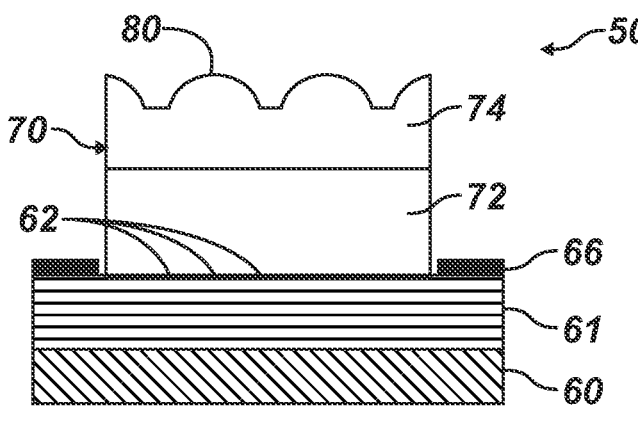
FIG. 6 schematically illustrates a side view of a laser assembly according to yet another configuration.

As disclosed in previous configurations, a polymer layer is dispensed on the substrate 60 to produce the micro-optic structure 70. If different resilience is needed, more than one layer of more than one type of material can be used. As shown in FIG. 6, for example, a potting resin 72 can first be disposed on the substrate 60. The potting resin 72 can use an appropriate optically clear resin. For example, this resin 72 can be a silicone-elastomer having Shore D hardness that provides structural rigidity. After the potting resin 72 cures, a polymer layer 74 is applied to the top of this cured resin layer 80, and the micro-optic elements 80 are nano-imprinted in the polymer layer 74. The polymer layer 74 can be a silicone elastomer, such as polydimethylsiloxane (PDMS), having a Shore A hardness, being softer than the potting resin 72.

The foregoing description of preferred and other embodiments is not intended to limit or restrict the scope or applicability of the inventive concepts conceived of by the Applicants. It will be appreciated with the benefit of the present disclosure that features described above in accordance with any embodiment or aspect of the disclosed subject matter can be utilized, either alone or in combination, with any other described feature, in any other embodiment or aspect of the disclosed subject matter.

What is claimed is:

1. A method of fabricating laser assemblies, the method comprising:

providing a substrate having first arrays of laser emitters on a first surface of the substrate being configured to emit optical signals;

providing electrical contacts on the first surface;

forming an optic structure on the first surface of the substrate by applying an optically transparent material to the first surface of the substrate; and configuring second arrays of micro-optical elements in optical communication with the optical signals emitted from the laser emitters of the first arrays by nano-imprinting the micro-optical elements in the optically transparent material of the optic structure.

2. The method of claim 1, wherein applying the optically transparent material to the substrate comprises dispensing a polymer layer directly on the substrate.

3. The method of claim 1, wherein the substrate comprises a second surfaces opposite the first surface; and wherein forming the optic structure on the substrate by applying the optically transparent material to the substrate comprises:

covering at least the electrical contacts with a protective layer;

applying the optically transparent material on the first surface of the substrate and the protective layer;

cutting away the optically transparent material from the protective layer; and exposing the electrical contacts by removing the protective layer from the electrical contacts.

4. The method of claim 3, wherein covering at least the electrical contacts with the protective layer comprises:

applying a photoresist material on the first surface of the substrate and the electrical contacts;

developing the photoresist material; and leaving at least the electrical contacts with the protective layer of negative or positive photoresist material by applying a developer.

5. The method of claim 4, wherein cutting away the optically transparent material from the protective layer comprises cutting the optically transparent material with a disc dicing blade.

6. The method of claim 1, wherein nano-imprinting the micro-optical elements in the optically transparent material of the optic structure comprises:

forming concave lenses, convex lenses, or both concave and convex lenses configured to field map the optical signals for the laser emitters;

forming collimating lenses configured to change the divergence of the optical signals for the laser emitters;

forming external cavities configured to reduce a number of modes of the optical signals for the laser emitters;

forming prisms configured to beam steer the optical signals for the laser emitters; or forming beam transformation surfaces configured to beam shape the optical signals for the laser emitters.

7. The method of claim 1, wherein nanoimprinting the micro-optical elements in the optically transparent material of the optic structure comprises defining a field mapping optic configured to refract the optical signals from the laser emitters of the first array to a desired irradiance at a target, each of the micro-optic elements being configured to refract the optical signal of a corresponding one of the laser emitters of the first array.

8. The method of claim 1, wherein nanoimprinting the micro-optical elements in the optically transparent material of the optic structure comprises arranging the micro-optical elements in one-to-one correspondence with the laser emitters of the first array.

9. The method of claim 1, wherein the laser emitters of the first array are vertical-cavity surface-emitting laser (VCSEL) emitters; and wherein the laser assemblies are flood illuminators.

10. The method of claim 1, further comprising singulating individual ones of the laser assemblies from one another, each having one of the first arrays of the laser emitters, a portion of the optic structure, and one of the second arrays of the micro-optical elements.

11. A laser assembly fabricated according to the method of claim 1.

12. A laser assembly, comprising:

a substrate;

a first array of laser emitters on a first surface of the substrate being configured to emit optical signals;

electrical contacts on the first surface of the substrate;

an optic structure of optically transparent material formed on the first surface of the substrate; and a second array of micro-optic elements nano-imprinted on the optic structure and arranged in optical communication with the optical signals emitted from the laser emitters.

13. The laser assembly of claim 12, wherein the optically transparent material of the optic structure comprises a polymer layer disposed directly on the substrate and having the second array of micro-optic elements nano-imprinted thereon.

14. The laser assembly of claim 12, wherein the optic structure is between the electrical contacts on the first surface.

15. The laser assembly of claim 12, wherein a first portion of the first surface has the optic structure; and wherein the substrate comprises the electrical contacts exposed on a second portion of the first surface and being configured to wire bond.

16. The laser assembly of claim 12, wherein the electrical contacts disposed on the first surface abut the optically transparent material.

17. The laser assembly of claim 12, wherein the micro-optic elements comprise:

concave lenses, convex lenses, or both concave and convex lenses configured to field map the optical signals for the laser emitters;

collimating lenses configured to change the divergence of the optical signals for the laser emitters;

external cavities configured to reduce a number of modes of the optical signals for the laser emitters;

prisms configured to beam steer the optical signals for the laser emitters; or beam transformation surfaces configured to beam shape the optical signals for the laser emitters.

18. The laser assembly of claim 12, wherein the laser emitters of the first array are vertical-cavity surface-emitting laser (VCSEL) emitters; and wherein the laser assembly is a flood illuminator.

19. The laser assembly of claim 12, wherein the second array of the micro-optic elements defines a field mapping optic configured to refract the optical signals from the laser emitters of the first array to a desired irradiance at a target, each of the micro-optic elements being configured to refract the optical signal of a corresponding one of the laser emitters of the first array.

20. The laser assembly of claim 19, wherein the micro-optic elements of the second array are arranged in one-to-one correspondence with the laser emitters of the first array.

* * * * *